United States Patent [19]

Miyazaki

[11] Patent Number: 5,083,096
[45] Date of Patent: Jan. 21, 1992

[54] HIGH FREQUENCY AMPLIFIER CIRCUIT CAPABLE OF OPTIMIZING A TOTAL POWER CONSUMPTION

[75] Inventor: Shinichi Miyazaki, Tokyo, Japan
[73] Assignee: NEC Corporation, Tokyo, Japan
[21] Appl. No.: 531,425
[22] Filed: May 31, 1990
[30] Foreign Application Priority Data May 31, 1989 [JP] Japan .................. 1-135923

[51] Int. Cl.$^5$ .............................................. H03G 3/30
[52] U.S. Cl. .................................. 330/279; 330/133; 330/285
[58] Field of Search .............. 330/127, 128, 129, 133, 330/279, 285; 455/127, 241, 251, 343

[56] References Cited
U.S. PATENT DOCUMENTS 3,413,570 11/1968 Bruene et al. ................ 328/58 X
4,442,407 4/1984 Apel .............................. 330/129 X

*Primary Examiner*—James B. Mullins
*Attorney, Agent, or Firm*—Sughrue, Mion, Zinn, Macpeak & Seas

[57] ABSTRACT

In a high frequency amplifier circuit comprising an input amplifier device (23) and an output amplifier (21) which are supplied with a total electric power of a supply current value variable dependent on a total power consumption in the input amplifier device and the output amplifier, a current detection circuit (30) detects the supply current value to product a current detection signal representative of the supply current value. A bias voltage control circuit (31) controls a bias voltage of the output amplifier in response to the current detection signal to make the total power consumption have an optimum value. Preferably, the bias voltage control circuit should comprise a bias voltage generator for generating a control voltage, a bias voltage controller for producing a bias control signal dependent on the supply current value, and a modulator for modulating the control voltage into a modulated voltage for use as the bias voltage.

7 Claims, 8 Drawing Sheets ated in FIG. 7;

HIGH FREQUENCY AMPLIFIER CIRCUIT CAPABLE OF OPTIMIZING A TOTAL POWER CONSUMPTION

BACKGROUND OF THE INVENTION

This invention relates to a high frequency amplifier circuit for producing an amplified output signal with automatic level control (ALC). The amplifier circuit is typically a radio frequency amplifier circuit and is particularly useful in a portable radio communication device.

The amplifier circuit comprises a high frequency output amplifier supplied with a bias voltage for amplifying an amplifier input signal into a circuit output signal which is the above-mentioned amplified output signal and is automatic level controlled in the manner which will presently be described. A high frequency input amplifier device is connected to the output amplifier and is for amplifying a circuit input signal into an intermediate amplified signal to deliver the intermediate amplified signal to the output amplifier as the amplifier input signal. Supplied with the circuit output signal back from the output amplifier, the input amplifier device makes the circuit output signal have a predetermined output level. In this manner, the automatic level control is carried out in the amplifier circuit comprising the input amplifier device and the output amplifier.

It is to be noted here that the circuit input signal has a variable input level. The amplifier input signal of the output amplifier has a gain controlled level. The input amplifier device may consist of a single high frequency input amplifier for producing the intermediate amplified signal. Alternatively, the input amplifier device may additionally comprise at least one high frequency intermediate amplifier connected to the input amplifier to produce the intermediate amplified signal for delivery to the output amplifier.

The amplifier circuit is naturally put into operation by electric power. When used in a portable radio communication device, the amplifier circuit is supplied with the electric power usually from a battery unit. The input amplifier device is supplied with a portion of the electric power as an input amplifier power. The output amplifier is supplied with another portion of the electric power as an output amplifier power. The amplifier circuit is kept in operation with a total power consumption of the electric power and is supplied with the electric power with a certain supply current value.

The power consumption should be kept as little as possible. It is therefore desirable to make the total power consumption have an optimum value. This can be achieved by making each of the input amplifier device and the output amplifier include a bias voltage control circuit. Use of such bias control circuits is, however, objectionable because the amplifier circuit becomes expensive.

SUMMARY OF THE INVENTION

It is therefore an object of this invention to provide a high frequency amplifier circuit which is capable of optimizing a total power consumption.

It is another object of this invention to provide a high frequency amplifier circuit of the type described which is not expensive.

Other objects of this invention will become clear as the description proceeds.

On describing the gist of this invention, it is possible to understand that a high frequency amplifier circuit comprises an output amplifier supplied with an output amplifier power and with a bias voltage for amplifying an amplifier input signal into a circuit output signal having an output level, input amplifier means connected to the output amplifier and supplied with an input amplifier power for amplifying a circuit input signal into an intermediate amplified signal to deliver the intermediate amplified signal to the output amplifier as the amplifier input signal and supplied with the circuit output signal for making the circuit output signal have a predetermined level. The input and the output amplifier power is herein collectively called a total electric power with a supply current value variable dependent on a total power consumption in the input amplifier means and the output amplifier. According to this invention, the above understood high frequency amplifier circuit is characterized by a current detection circuit supplied with the total electric power for detecting the supply current value to produce a current detection signal representative of the supply current value, and a bias voltage control circuit connected to the current detection circuit and the output amplifier for controlling the bias voltage in response to the current detection signal to make the total power consumption have an optimum value.

DESCRIPTION OF THE PREFERRED EMBODIMENT

Figure 1:
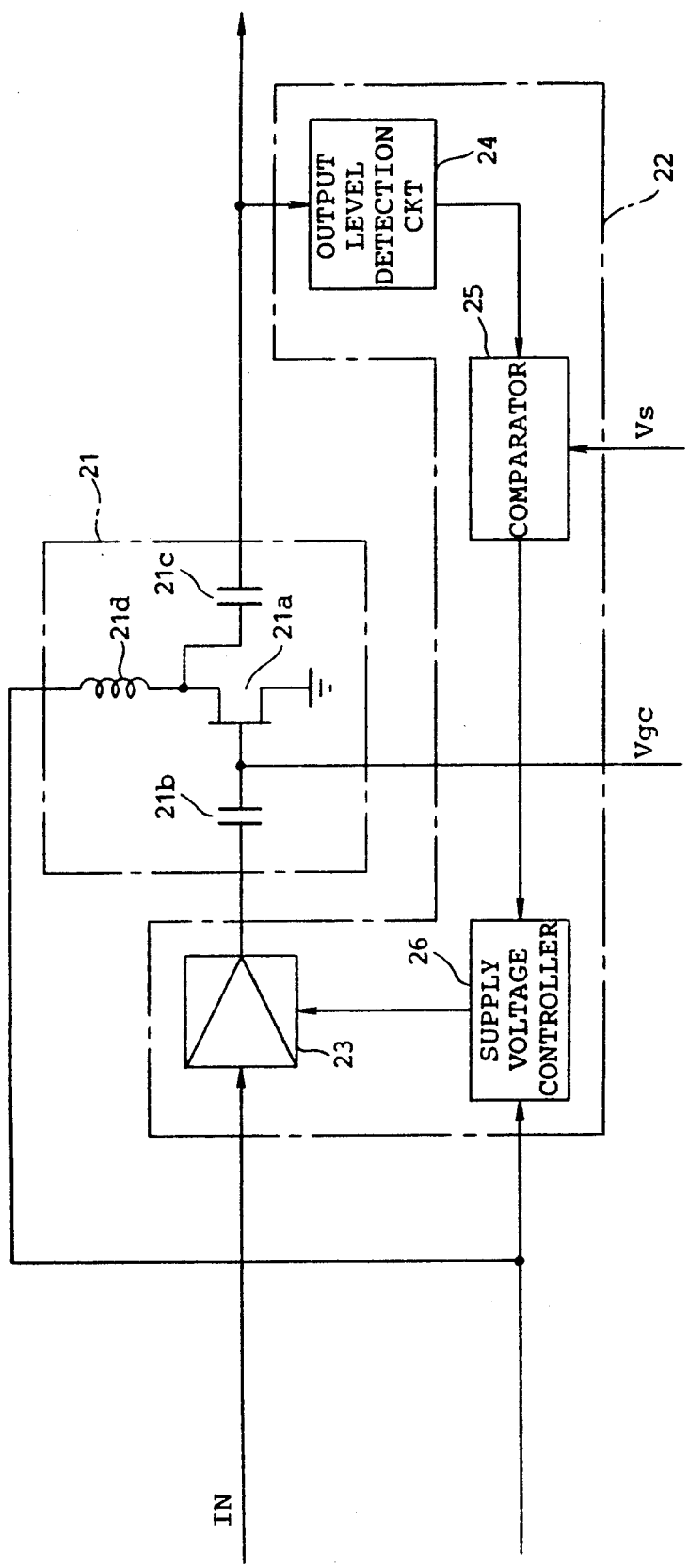
FIG. 1 is a block diagram of a conventional high frequency amplifier circuit.

Referring to FIG. 1, a conventional high frequency amplifier circuit will be described at first in order to facilitate an understanding of the present invention. The amplifier circuit is typically a radio frequency amplifier circuit and is particularly useful in a portable radio communication device. The amplifier circuit amplifies a circuit input signal IN into an amplified output signal having an output level.

The amplifier circuit comprises a high frequency output amplifier 21 which comprises an output FET (field effect transistor) 21a supplied with a bias voltage Vgc of a constant level from a bias voltage supply unit (not shown). The output amplifier 21 further comprises first and second coupling capacitors 21b and 21c and a choke coil 21d. The output amplifier 21 is for amplifying an amplifier input signal into a circuit output signal which is the above-mentioned amplified output signal and which is automatic level controlled in the manner which will shortly be described. A high frequency input amplifier unit 22 is connected to the output amplifier 21 through the first coupling capacitor 21b and comprises a high frequency input amplifier device 23 which comprises an input FET (not shown). As will later be described, the input amplifier unit 22 serves as an automatic level control (ALC) circuit.

The input amplifier device 23 may consist of a single high frequency input amplifier for amplifying the circuit input signal IN into an intermediate amplified signal to deliver the intermediate amplified signal to the output amplifier 21 as the amplifier input signal. Alternatively, the input amplifier device 23 may additionally comprise at least one high frequency intermediate amplifier connected to the input amplifier to produce the intermediate amplified signal for delivery to the output amplifier 21.

The input amplifier unit 22 further comprises an output level detection circuit 24 supplied with the circuit output signal from the output amplifier 21. The output level detection circuit 24 detects the circuit output signal to produce a d.c. voltage as a level detection signal representative of the output level. The level detection signal is sent to a comparator 25 which is supplied with a reference voltage signal of a d.c. reference voltage Vs from a reference voltage generator (not shown). The reference voltage signal is used in giving a predetermined output level to the circuit output signal. The comparator 25 compares the level detection signal with the reference voltage signal to produce a supply voltage control signal representative of a result of comparison between the level detection signal and the reference voltage signal. The supply voltage control signal has a control signal level. The supply voltage control signal is supplied to a supply voltage controller 26 which is given a supply voltage from a power supply unit (not shown). The supply voltage is controlled by the supply voltage control signal. The input amplifier device 23 is supplied with a controlled supply voltage from the supply voltage controller 26 and makes the circuit output signal have the predetermined output level.

It is to be noted here that the circuit input signal has a variable input level. The amplifier input signal of the output amplifier 21 has a gain controlled level.

The amplifier circuit is naturally put into operation by electric power. When used in the portable radio communication device, the amplifier circuit is supplied with the electric power from a battery unit used as the power supply unit. The input amplifier device 23 is supplied with a portion of the electric power as an input amplifier power through the supply voltage controller 26. The output amplifier 21 is supplied with another portion of the electric power as an output amplifier power through the choke coil 21d. The amplifier circuit is kept in operation with a total power consumption or the electric power and is supplied with the electric power with a certain supply current value. The total power consumption should be kept as little as possible. It is therefore desirable to make the total power consumption have an optimum value.

It is to be noted in this connection that the total power consumption is influenced by fluctuation of the gain controlled level. However, no consideration is made about compensating for the fluctuation of the gain controlled level. In other words, the output amplifier 21 can not compensate the fluctuation of the gain controlled level because the output FET 21a is supplied with the bias voltage Vgc of the constant level. This means that the output amplifier 21 wastes the output amplifier power. Such a defect also applies to the input amplifier device 23. Consequently, the amplifier circuit has a degraded power consumption efficiency.

The input FET and the output FET 21a have transistor characteristics which are different from each other. The power consumption efficiency of the amplifier circuit is influenced by the transistor characteristics. In order to optimize the power consumption efficiency, each of the input amplifier device and the output amplifier should include a bias voltage control circuit. Use of such bias control circuits is, however, objectionable because the amplifier circuit becomes expensive.

Figure 2:
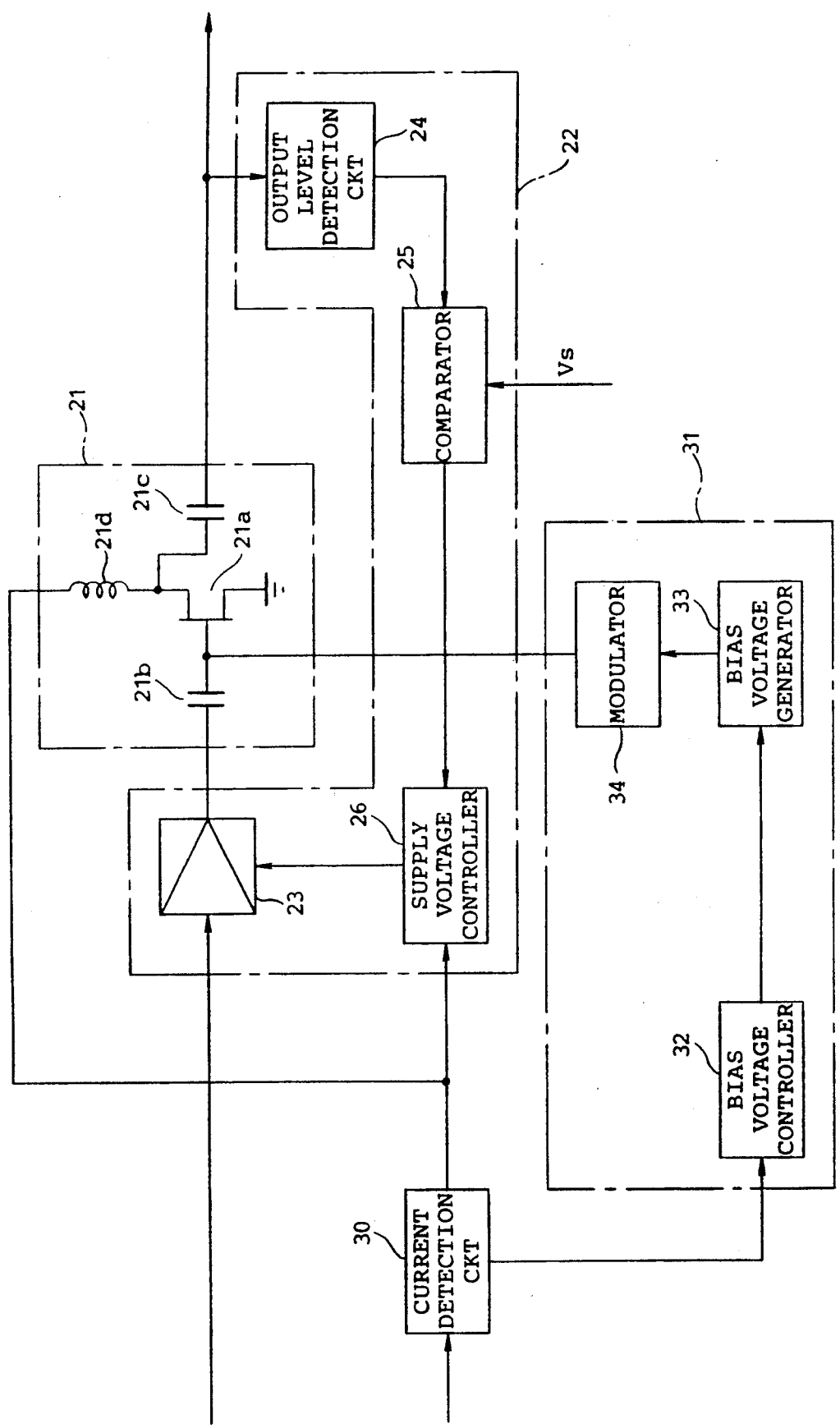
FIG. 2 is a block diagram of a high frequency amplifier circuit according to a first embodiment of this invention.

Referring to FIG. 2, the description will proceed to a high frequency amplifier circuit according to a first embodiment of this invention. The amplifier circuit comprises similar parts designated by like reference numerals and additionally a current detection circuit 30 and a bias voltage control circuit 31.

In FIG. 2, the amplifier circuit is kept in operation with the total power consumption and is supplied from the power supply unit with the electric power with supply current having a certain phase relative to the supply voltage and a certain supply current value IS through the current detection circuit 30. The input amplifier device 23 is supplied with a portion of the electric power as an input amplifier power with a first supply current value IS1 through the supply voltage controller 26. The output amplifier 21 is supplied with another portion of the electric power as an output amplifier power with a second supply current value IS2. Supplied with electric power, the current detection circuit 30 detects the supply current to produce a current detection signal representative of the phase of the supply current and the supply current value IS. As will presently be described more in detail, the bias voltage control circuit 31 is for controlling a bias voltage Vg in response to the current detection signal to make the total power consumption have an optimum value.

Figure 3:
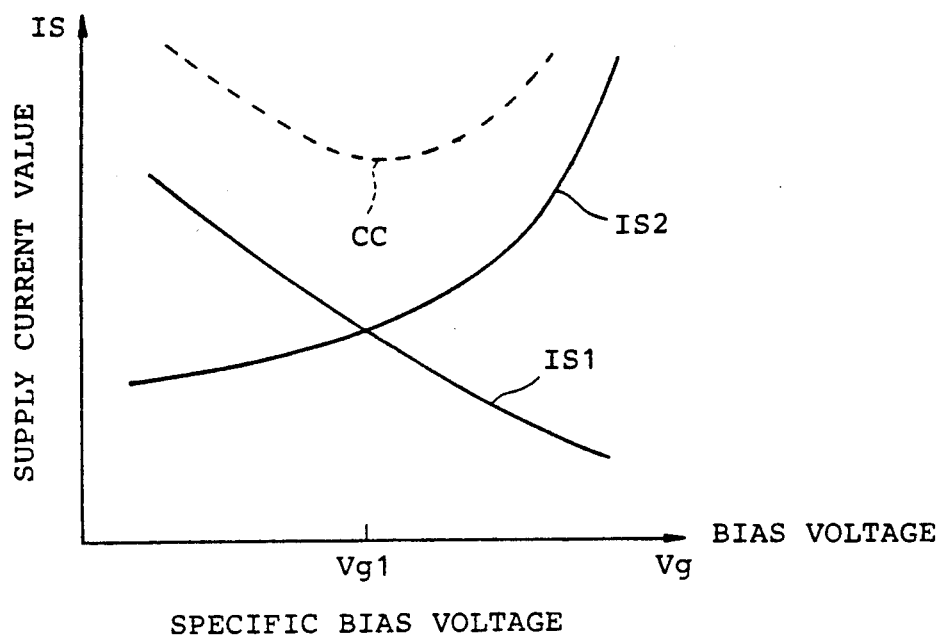
FIG. 3 is a graphical representation for use in describing first and second supply current values in an input amplifier device and an output amplifier shown in FIG. 2.

Referring to FIG. 3, let the output level of the circuit output signal is kept at the predetermined output level by the automatic level control circuit as mentioned before. In the example being illustrated, the first supply current value IS1 decreases as the bias voltage Vg increases. The second supply current value IS2 increases as the bias voltage Vg increases. The supply current value IS is a sum of the first and the second supply current values IS1 and IS2 and is defined by a current characteristic CC shown by a dashed-line curve. In this case, if the bias voltage Vg decreases, the output amplifier 21 amplifies the intermediate amplified signal with a low gain because the second supply current value IS2 decreases. However, the circuit input signal is amplified by the input amplifier device 23 with a high gain because the first supply current value IS1 is increased by the automatic level control circuit. Namely, the first supply current value IS1 increases when the second supply current value IS2 decreases. It is to be noted here that the supply current value IS becomes equal to a minimum value when the output amplifier 21 is supplied with a specific bias voltage Vg1 even though the output level is kept at the predetermined output level. The specific bias voltage Vg1 is defined by the first and the second supply current values IS1 and IS2 which are equal to each other. Under the circumstances, the bias voltage Vg should be controlled by the bias voltage control circuit 31 in accordance with the current characteristic CC.

Figure 4:
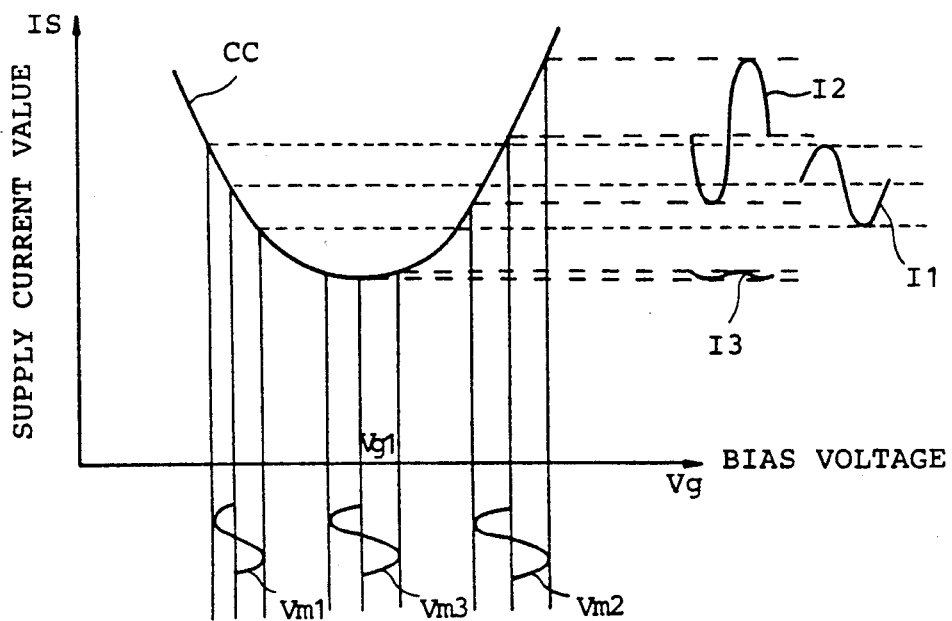
FIG. 4 is a graphical representation for use in describing a current characteristic of a supply current value in the high frequency amplifier circuit shown in FIG. 2.

Referring to FIG. 4, the current characteristic CC has a portion depicted in a left half of the current characteristic CC and decreases with an increase in the bias voltage Vg of the output amplifier 21. Another portion is depicted in a right half of the current characteristic CC and increases with the increase in the bias voltage Vg. An extremum point is present between the decreasing and the increasing portions. Let the bias voltage Vg be modulated into a modulated bias voltage by amplitude modulation. In this event, the supply current value IS varies dependent upon variation of the modulated bias voltage. For example, when the output amplifier 21 is supplied with the modulated bias voltage which is depicted at Vm1 and which is lower than the specific bias voltage Vg1, the supply current is depicted at I1 and has a first supply current value and a first phase. Similarly, when the output amplifier 21 is supplied with the modulated bias voltage which is depicted at Vm2 and which is higher than the specific bias voltage Vg1, the supply current is depicted at I2 and has a second supply current value and a second phase. It is to be noted here that the first phase leads $\pi$ radian relative to the second phase. The current detection signal indicates leading and lagging phases when the supply current has the supply current values I1 and I2. The supply current depicted at I3 has a third supply current value which is much smaller than the first and the second supply current values when the output amplifier 21 is supplied with the modulated bias voltage which is depicted at Vm3 and which is substantially equal to the specific bias voltage Vg1. Under the circumstances, it will be understood that the total power consumption has the optimum value when the output amplifier 21 is supplied with the modulated bias voltage Vm3 because the third supply current value becomes equal to a minimum value.

Turning back to FIG. 2, the bias voltage control circuit 31 comprises a bias voltage controller 32, a bias voltage generator 33, and a modulator 34. The bias voltage controller 32 is supplied with the current detection signal from the current detection circuit 30 and produces a bias voltage control signal having a bias voltage control level dependent on the supply current value IS. The bias voltage controller 32 comprises a phase detector (not shown) for detecting the phase represented by the current detection signal. Operation of the bias voltage controller 32 will now be described strictly. By detecting the phase represented by the current detection signal, the bias voltage controller 32 decides whether the supply current value IS is in the decreasing or the increasing portions of the current characteristic CC (FIG. 4). When the supply current value is in the decreasing portion, the bias voltage controller 32 produces the bias voltage control signal which serves to increase the bias voltage Vg up to the specific bias voltage Vg1. On the contrary, the bias voltage controller 32 produces the bias voltage control signal which serves to decrease the bias voltage Vg down to the specific voltage Vg1, when the supply current value IS is in the increasing portion. In this manner, the bias voltage controller 32 produces the bias voltage control signal so that the supply current value IS becomes equal to the minimum value.

The bias voltage generator 33 generates a control voltage which is controlled by the bias voltage control signal. The control voltage is supplied to the modulator 34. As will later be described more in detail, the modulator 34 comprises a pulse generator (not shown) for generating a pulse signal and modulates the control voltage into a modulated voltage by using the pulse signal. The modulator 34 supplies the modulated voltage for use as the bias voltage to the output amplifier 21. Thus, the total power consumption is kept at the optimum value.

A gallium-arsenide type FET may be used as the output FET 21a. When the supply voltage is 6 volts high, the input amplifier device 23 is given a constant bias voltage of minus 4 volts. The bias voltage Vg is controlled between minus 1.5 volts and minus 4 volts. When the circuit input signal of 5 milliwatts reaches the amplifier circuit, the circuit output signal should be 30 dBm.

It should be noted in general that the battery unit has a restricted voltage. The first supply current value IS1 is restricted to a predetermined value when the output level of the circuit output signal should keep a high level.

Figure 5:
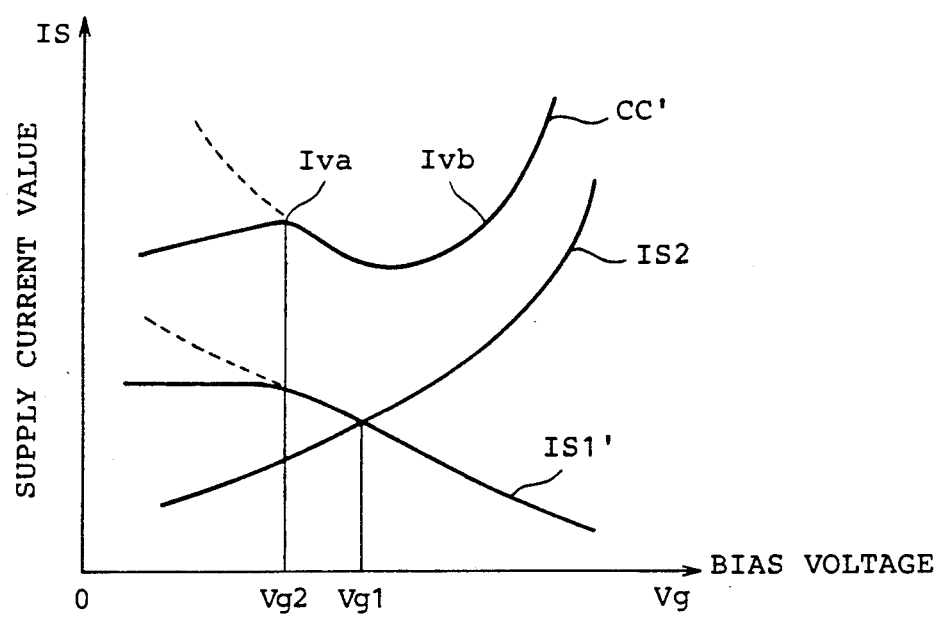
FIG. 5 is a graphical representation for use in describing another current characteristic of a supply current value in the high frequency amplifier circuit shown in FIG. 2.

Referring to FIG. 5, let the first supply current value be restricted to the predetermined value as exemplified at IS1'. The current characteristic becomes different from that depicted in FIG. 3 and is depicted as a different current characteristic CC'. The current characteristic CC' represents the supply current value which is a sum of the first and the second supply current values IS1' and IS2. The current characteristic CC' has a restricted portion deviated from a corresponding portion of the current characteristic CC that is shown by a dashed line. When the first supply current value IS1' is restricted, it is difficult to keep the output level at the predetermined output level. Moreover, if the bias voltage Vg is reduced down to a prescribed bias voltage Vg2 which corresponds to a supply current value Iva located between the restricted portion and the decreasing portion of the current characteristic CC', the bias voltage control circuit 31 may serve so as to reduce the bias voltage Vg. This means that the bias voltage control circuit 31 falls into an uncontrollable state. This is because the bias voltage control circuit 31 fails to discriminate the supply current value Iva in the restricted portion from a supply current value Ivb in the increasing portion. Under the circumstances, the bias voltage Vg should be kept at the prescribed voltage Vg2 when the first supply current value IS1' is restricted at the predetermined value.

Figure 6:
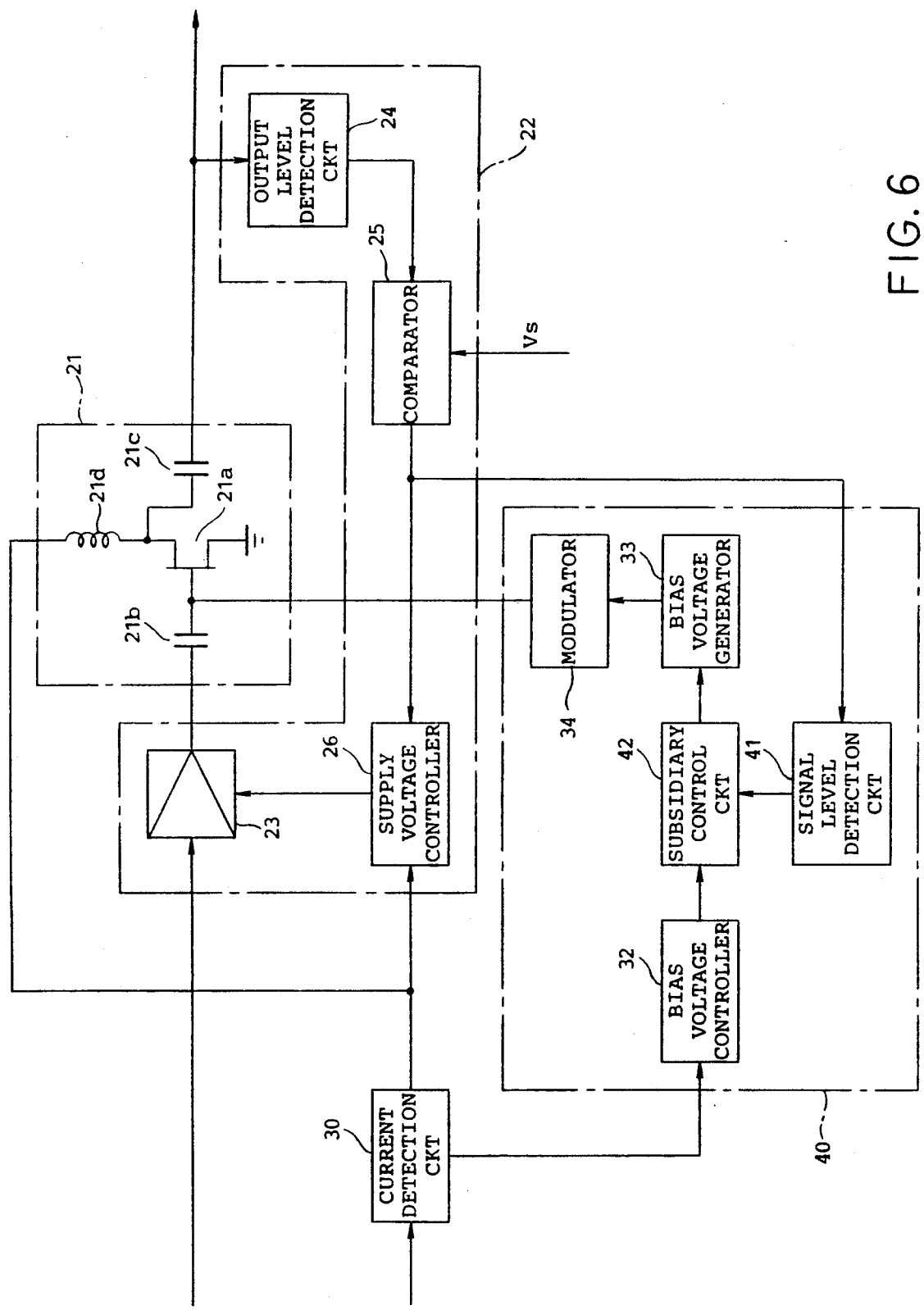
FIG. 6 is a block diagram of a high frequency amplifier circuit according to a second embodiment of this invention.

Referring to FIG. 6, the description will proceed to a high frequency amplifier circuit according to a second embodiment of this invention. The amplifier circuit is similar to the amplifier circuit illustrated in FIG. 2 except that a bias voltage control circuit 40 is used instead of the bias voltage control circuit 31. The bias voltage control circuit 40 comprises a signal level detection circuit 41 and a subsidiary control circuit 42 in addition to the bias voltage controller 32, the bias voltage generator 33, and the modulator 34. The bias voltage control circuit 40 keeps the bias voltage Vg at the prescribed bias voltage Vg2 when the first supply current value IS1' is restricted to the predetermined value. When the first supply current value IS1' is restricted to the predetermined value, the comparator 25 produces the supply voltage control signal having the control signal level which is higher than a predetermined control level to make the supply voltage controller 26 supply the input amplifier device 23 with the supply voltage of a maximum level.

The signal level detection circuit 41 detects whether or not the control signal level is lower than the predetermined control level. The signal level detection circuit 41 delivers a detection signal to the subsidiary control circuit 42 when the control signal level is not lower than the predetermined control level. Supplied with the detection signal, the subsidiary control circuit 42 stops supply of the bias voltage control signal to the bias voltage generator 33 to keep the bias voltage Vg at the prescribed bias voltage Vg2. Namely, the bias voltage generator 33 supplies the control voltage to the modulator 34 with a predetermined voltage on stop of the bias voltage control signal. The modulator 34 modulates the control voltage into the modulated voltage for use as the prescribed bias voltage Vg2. The detection signal may be supplied to the modulator 34. In this event, the modulator 34 stops modulation of the control voltage on reception of the detection signal and produces the control voltage as it stands for use as the prescribed bias voltage Vg2. If the first supply current value IS1' is lower than the predetermined value, namely, if the control signal level is lower than the predetermined control level, operation of the bias voltage control circuit 40 is similar to that of the bias voltage control circuit 31.

Figure 7:
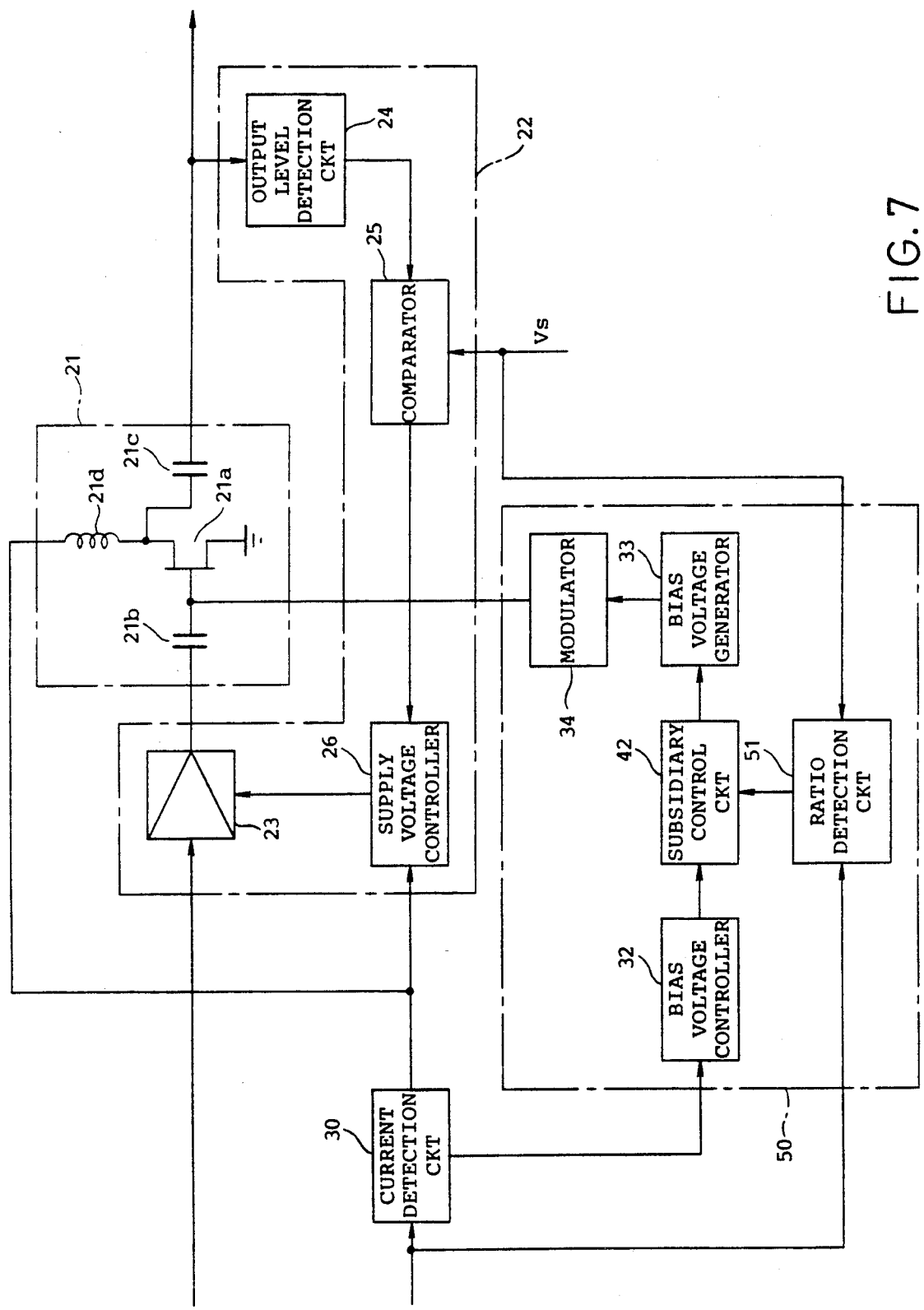
FIG. 7 is a block diagram of a high frequency amplifier circuit according to a third embodiment of this invention.

Referring to FIG. 7, the description will be made as regards a high frequency amplifier circuit according to a third embodiment of this invention. The amplifier circuit is similar to the amplifier circuit illustrated in FIG. 6 except that a bias voltage control circuit 50 is used instead of the bias voltage control circuit 40. The bias voltage control circuit 50 comprises a ratio detection circuit 51 instead of the signal level detection circuit 41 illustrated in FIG. 6. The ratio detection circuit 51 is supplied with the supply voltage and the reference voltage.

It is to be noted here that the first supply current value IS1' is restricted when the comparator 25 is supplied with a high reference voltage in order to increase the first supply current IS1', namely, in order to keep the output level at a high level, although the supply voltage is low. By detecting a ratio of the reference voltage to the supply voltage, it is possible to detect whether or not the first supply current value IS1' is restricted.

Supplied with the supply voltage and the reference voltage, the ratio detection circuit 51 detects the ratio of the reference voltage to the supply voltage. The ratio detection circuit 51 delivers a ratio detection signal to the subsidiary control circuit 42 when the ratio is not higher than a predetermined ratio. Supplied with the ratio detection signal, the subsidiary control circuit 42 stops supply of the bias voltage control signal to the bias voltage generator 33 to keep the bias voltage Vg at the prescribed bias voltage Vg2. The bias voltage generator 33 supplies the control voltage to the modulator 34 with the predetermined voltage on stop of the bias voltage control signal. The modulator 34 modulates the predetermined voltage into the modulated voltage for use as the prescribed bias voltage Vg2. If the ratio is higher than the predetermined ratio, operation of the bias voltage control circuit 50 is similar to that of the bias voltage control circuit 40 illustrated in FIG. 6.

Figure 8:
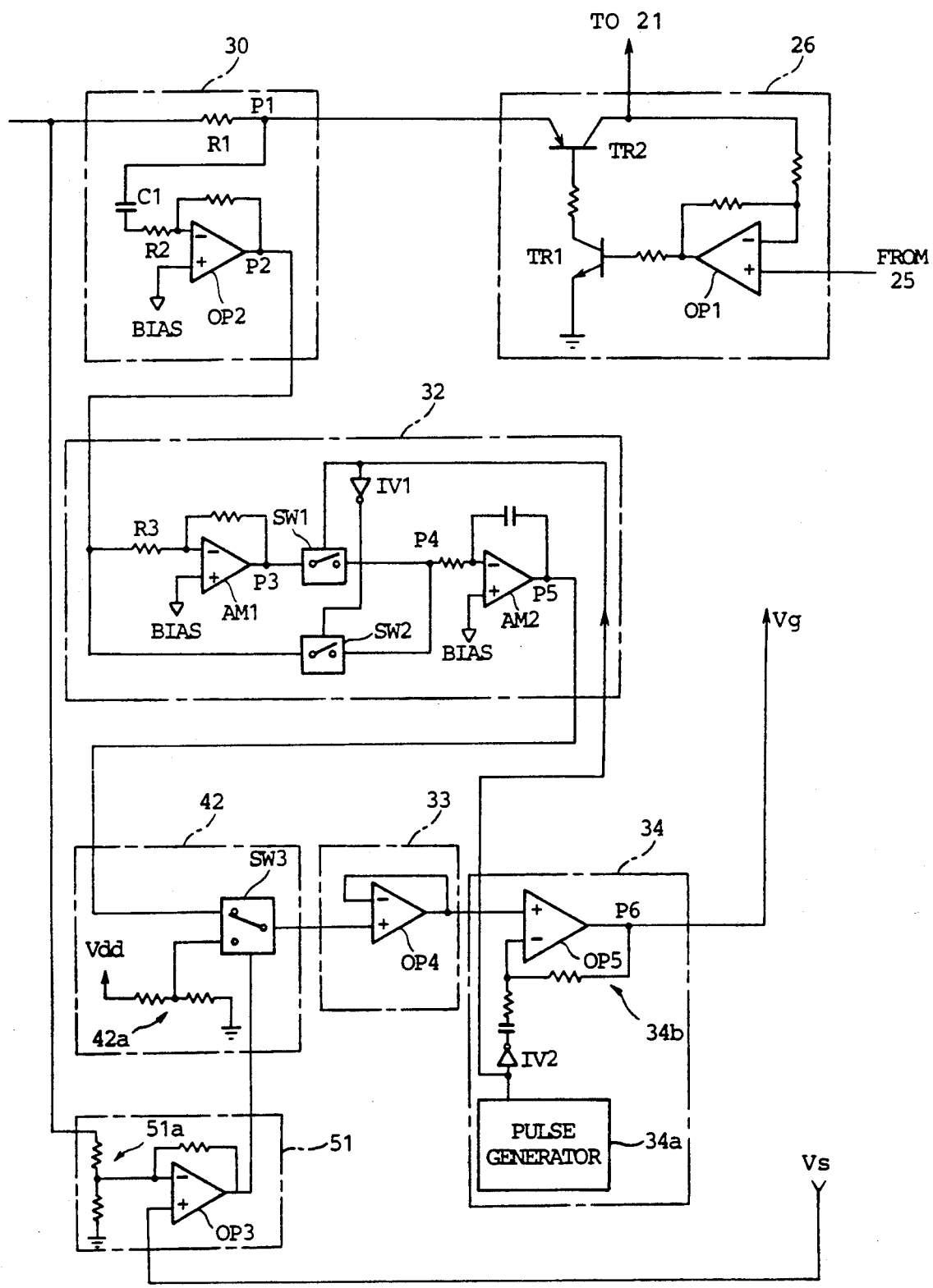
FIG. 8 shows a partial circuit arrangement which is suitable for the high frequency amplifier circuit illustrated in FIG. 7.
Figure 9:
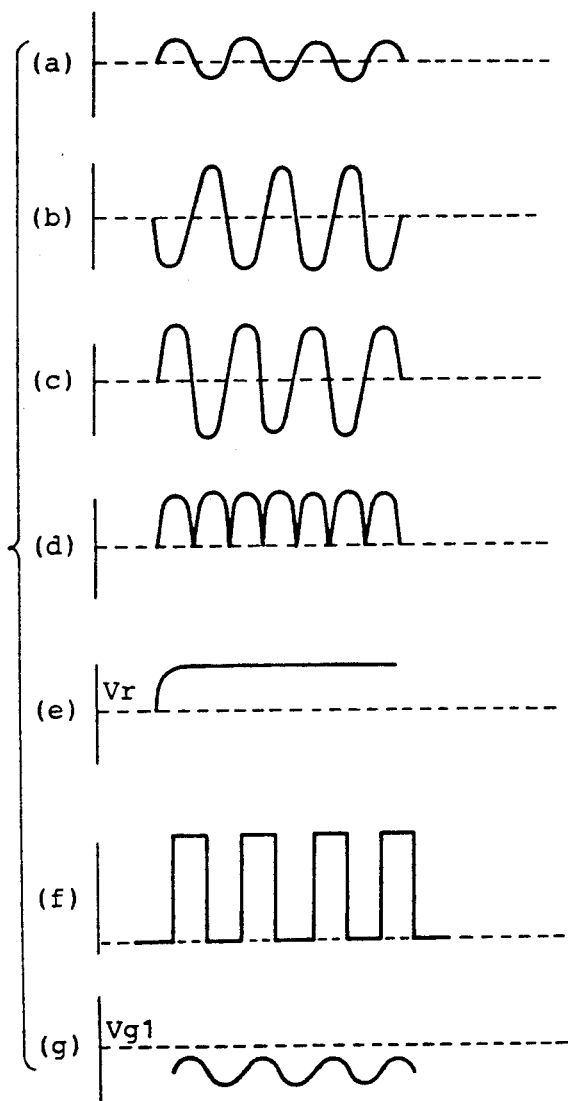
FIG. 9 illustrates signal waveforms for use in describing operation of the circuit arrangement illustrated in FIG. 8.
Figure 10:
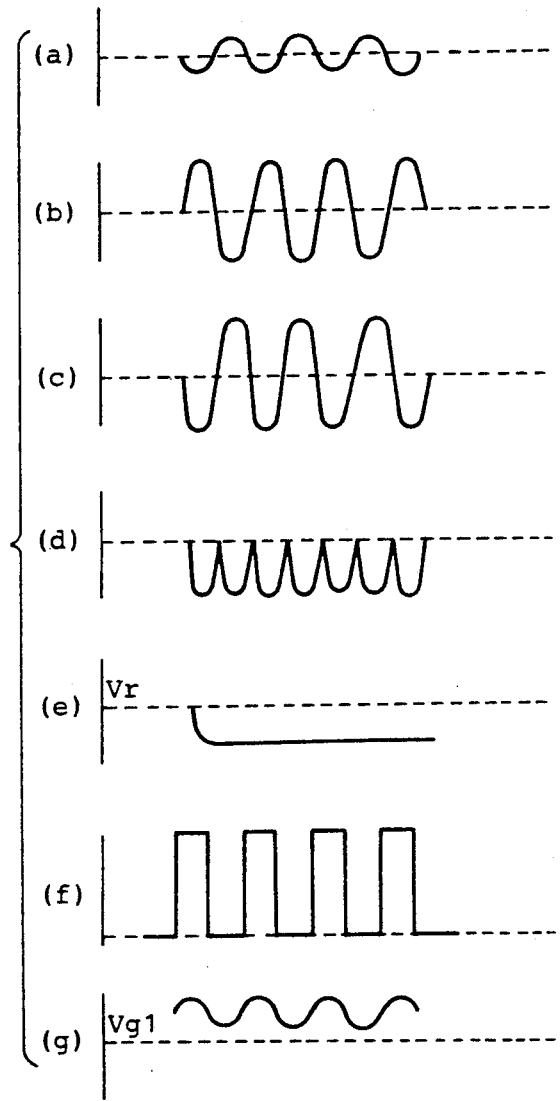
FIG. 10 illustrates signal waveforms for use in describing operation of the circuit arrangement illustrated in FIG. 8.

Referring to FIGS. 8, 9, and 10, the description will proceed to a circuit arrangement which is suitable for the high frequency amplifier circuit illustrated with reference to FIG. 7.

In FIG. 8, the supply voltage controller 26 comprises a first operational amplifier OP1 supplied with the supply voltage control signal from the comparator 25 through a non-inverting input terminal. A first transistor TR1 is connected to an output terminal of the first operational amplifier OP1. A second transistor TR2 is supplied with the supply voltage through the current detection circuit 30. In the manner known in the art, the supply voltage controller 26 controls the supply voltage by the use of the supply voltage control signal and supplies a controlled supply voltage to the input amplifier device 23.

The current detection circuit 30 is supplied with the electric power through a first resistor R1. The first resistor R1 is used in detecting a variation which occurs in the supply voltage dependent on variation of the supply current value IS. The supply current value IS varies as illustrated in FIG. 9(a) when the supply current value IS is in the decreasing portion of the current characteristic CC' shown in FIG. 5. The supply current value IS varies as illustrated in FIG. 10(a) when the supply current value IS is in the increasing portion of the current characteristic CC'. It is to be noted here that the supply current value IS shown in FIG. 9(a) has the phase which is different from the phase of the supply current value IS shown in FIG. 10(a).

In FIG. 8, the variation of the supply voltage is detected at a point P1 through a first capacitor C1. The first capacitor C1 is for detecting the variation of the supply current value IS as variation of a charged voltage. By the use of a second operational amplifier OP2 connected to the first capacitor C1 through a second resistor R2, the variation of the charged voltage is amplified into an amplified voltage. The amplified voltage is generated at a point P2 and is illustrated in FIGS. 9(b) and 10(b) to be supplied, as the current detection signal, to the bias voltage controller 32. The amplified voltage has an inverse phase relative to the phase of the supply current value IS because the phase of the supply current is inverted by the second operational amplifier OP2. Thus, the current detection circuit 30 detects the variation of the supply current value in the form of the variation of the supply voltage.

The bias voltage controller 32 comprises an inverting amplifier AM1, first and second switching circuits SW1 and SW2, and an integrating amplifier AM2. The inverting amplifier AM1 is supplied with the amplified voltage through a third resistor R3 and is connected to the first switching circuit SW1. The inverting amplifier AM1 has an amplification factor equal to unity and produces an inverted voltage having an inverted phase relative to the phase of the amplified voltage. The inverted voltage is generated at a point P3 and is illustrated in FIGS. 9(c) and 10(c). The first switching circuit SW1 is connected to the inverting amplifier AM1 and the integrating amplifier AM2 and is controlled by the pulse signal supplied from the modulator 34 which will later be described. The second switching circuit SW2 is connected to the second operational amplifier OP2 and the integrating amplifier AM2 and is controlled by the pulse signal through a first inverter IV1. As a result, the first switching circuit SW1 is turned on and turned off in synchronism with the pulse signal when the supply current value IS is in the decreasing portion of the current characteristic CC'. The first switching circuit SW1 serves to supply a positive-going full wave rectified waveform of the amplified voltage to the integrating amplifier AM2. The positive-going full wave rectified waveform is generated at a point P4 and is illustrated in FIG. 9(d).

The second switching circuit SW2 is turned on and turned off in synchronism with the pulse signal when the supply current value IS is in the increasing portion of the current characteristic CC'. The second switching circuit SW2 serves to supply a negative-going full wave rectified waveform of the amplified voltage to the integrating amplifier AM2. The negative-going full wave rectified waveform is generated at the point P4 is illustrated in FIG. 10(d). The inverting amplifier AM1 and the first and the second switching circuits SW1 and SW2 may be collectively called a phase detector because the positive-going and the negative-going full wave rectified waveforms are delivered in accordance with the phase of the supply current.

When the supply current value IS is in the decreasing portion of the current characteristic CC', the integrating amplifier AM2 integrates the positive-going full wave rectified waveform. The integrating amplifier AM2 produces an integrated voltage signal, as the bias voltage control signal. In the manner depicted at FIG. 9(e), this integrated voltage signal grows from a reference level Vr indicated by a dashed horizontal line and may herein be referred to as an increasing voltage signal. The increasing voltage signal is generated at a point P5 and serves to raise the bias voltage Vg up to the specific bias voltage Vg1. On the other hand, the integrating amplifier AM2 integrates the negative-going full wave rectified waveform when the supply current value IS is in the increasing portion of the current characteristic CC'. The integrating amplifier AM2 produces another integrated voltage signal, as the bias voltage control signal. In the manner depicted at FIG. 10(e), later integrated voltage signal decreases from the reference level and may herein be referred to as a decreasing voltage signal. The decreasing voltage signal is generated at the point P5 and serves to decrease the bias voltage Vg down to the specific bias voltage Vg1.

The ratio detection circuit 51 comprises a third operational amplifier OP3 and a first voltage dividing circuit 51a supplied with the supply voltage. The third operational amplifier OP3 is supplied with the reference voltage Vs and a divided supply voltage divided by the first voltage dividing circuit 51a. As described before, the ratio detection circuit 51 detects the ratio of the reference voltage to the supply voltage and delivers the ratio detection signal to the subsidiary control circuit 42 when the ratio is not higher than the predetermined ratio, namely, when the high reference voltage is supplied to the comparator 25, although the supply voltage is low.

The subsidiary control circuit 42 comprises a third switching circuit SW3 supplied with the bias voltage control signal and a second voltage dividing circuit 42a supplied with a driving voltage Vdd. Supplied with the ratio detection signal, the third switching circuit SW3 stops supply of the bias voltage control signal to the bias voltage generator 33. Otherwise, the third switching circuit SW3 supplies a divided driving voltage divided by the second voltage dividing circuit 42a.

The bias voltage generator 33 comprises a fourth operational amplifier OP4. The fourth operational amplifier OP4 converts one of the bias voltage control signal and the divided driving voltage into a converted voltage dependent on operation of the third switching circuit SW3. The converted voltage is used as the control voltage.

The modulator 34 comprises a pulse generator 34a and a differentiation circuit 34b comprising a fifth operational amplifier OP5 supplied with the control voltage from the bias voltage generator 33. The pulse generator 34a generates the pulse signal illustrated in FIGS. 9(f) and 10(f). The pulse signal is supplied to an inverting input terminal of the differentiation circuit 34b through a second inverter IV2. The differentiation circuit 34b modulates the control voltage with the pulse signal into the modulated signal for use as the bias voltage Vg. At a point P6, the modulated signal rises up to the specific bias voltage Vg1 from the state shown in FIG. 9(g) when the supply current value IS is in the decreasing portion of the current characteristic CC'. On the other hand, the modulated signal is decreased down to the specific bias voltage Vg1 from the state shown in FIG. 10(g) when the supply current value IS is in the increasing portion of the current characteristic CC'.

The pulse signal should have a frequency which is lower than that of an information signal carried by the circuit input signal. When an audio signal is carried by the circuit input signal, the pulse signal should preferably have a frequency selected between 50 and 60 Hz.

While this invention has thus far been described in conjunction with a few embodiments thereof, it will readily possible for those skilled in the art to put this invention into practice in various other manners. For example, the pulse generator 34a may be placed in the bias voltage controller 32 rather than in the modulator 34. In this event, the pulse signal is supplied to the modulator 34 from the bias voltage controller 32.

What is claimed is:

1. A high frequency amplifier circuit comprising:
an output amplifier supplied with an output amplifier power and with a bias voltage for amplifying an amplifier input signal into a circuit output signal having an output level;
input amplifier means, connected to said output amplifier and supplied with an input amplifier power, for amplifying a circuit input signal into an intermediate amplified signal to deliver said intermediate amplified signal to said output amplifier as said amplifier input signal and supplied with said circuit output signal to make said circuit output signal have a predetermined level wherein, said input and said output amplifier power being a total electric power with a supply current value variable dependent on a total power consumption in said input amplifier means and said output amplifier,
a current detection circuit supplied with said total electric power for detecting said supply current value to produce a current detection signal representative of said supply current value; and
a bias voltage control circuit connected to said current detection circuit and said output amplifier for controlling said bias voltage in response to said current detection signal to make said total power consumption have an optimum value.

2. A high frequency amplifier circuit as claimed in claim 1, wherein said bias voltage control circuit comprises:
- a voltage generator for generating a control voltage;
- a voltage controller connected to said current detection circuit for producing a bias voltage control signal dependent on said supply current value; and
- a modulator connected to said voltage generator for modulating said control voltage into a modulated voltage for use as said bias voltage.

3. A high frequency amplifier circuit as claimed in claim 1, wherein said input amplifier means comprises:
- an input amplifier device supplied with said input amplifier power for amplifying said circuit input signal into said intermediate amplified signal;
- an output level detection circuit connected to said output amplifier for detecting said output level to produce a level detection signal representative of said output level;
- a comparator connected to said output level detection circuit and supplied with a reference voltage signal having a reference voltage for comparing said level detection signal with said reference voltage signal to produce a voltage control signal having a control signal level representative of a result of comparison between said level detection signal and said reference voltage signal; and
- a supply voltage controller connected to said comparator for controlling a supply voltage of said input amplifier power to keep said output level at said predetermined level.

4. A high frequency amplifier circuit as claimed in claim 3, wherein said bias voltage control circuit comprises:
- a voltage generator for generating a control voltage;
- a voltage controller connected to said current detection circuit for producing a bias voltage control signal dependent on said supply current value;
- a modulator connected to said voltage generator for modulating said control voltage into a modulated voltage for use as said bias voltage;
- a signal level detection circuit connected to said comparator for detecting whether or not said control signal level is lower than a predetermined control level, said signal level detection circuit thereby producing a detection signal when said control signal level is not lower than said predetermined control level; and
- a subsidiary control circuit connected to said voltage generator and said signal level detection circuit for controlling supply of said bias voltage control signal to said voltage generator to keep said modulated voltage at a predetermined voltage.

5. A high frequency amplifier circuit as claimed in claim 3, wherein said bias voltage control circuit comprises:
- a voltage generator for generating a control voltage;
- a voltage controller connected to said current detection circuit for producing a bias voltage control signal dependent on said supply current value;
- a modulator connected to said voltage generator for modulating said control voltage into a modulated voltage for use as said bias voltage;
- a ratio detection circuit supplied with a supply voltage and a reference voltage for detecting a ratio of said reference voltage to said supply voltage to produce a detection signal when said ratio is not higher than a predetermined ratio; and
- a subsidiary control circuit connected to said voltage generator and said ratio detection circuit for controlling supply of said bias voltage control signal to said voltage generator to keep said modulated voltage at a predetermined value.

6. A high frequency amplifier circuit comprising:
- first amplifier means for amplifying a circuit input signal to produce a first output signal;
- second amplifier ,eams connected to said first amplifier means and supplied with a bias voltage for amplifying said first output signal to produce a second output signal as a circuit output signal;
- automatic level control means for controlling said first amplifier means to make said second output signal have a predetermined level;
- current detection means for detecting a total power consumption in said first and said second amplifier means to produce a current detection signal; and
- bias voltage control means responsive to said current detection signal for controlling said bias voltage to cause said total power consumption to be an optimum value.

7. A method of achieving an optimum value of total power consumption in an amplifying circuit, the method comprising the steps of:
(a) amplifying a circuit input signal to produce a first output signal;
(b) producing an output signal in response to said first output signal and a bias voltage signal;
(c) detecting a total power consumption of said circuit during said amplifying and producing steps, and outputting a current detection signal indicative of the total power consumption; and
(d) adjusting said bias voltage signal in response to said current detection signal to achieve the optimum value of total power consumption.

* * * * *